(12) United States Patent
Sasaki

(10) Patent No.: US 7,903,396 B2
(45) Date of Patent: Mar. 8, 2011

(54) COVER STRUCTURE, ELECTRONIC EQUIPMENT AND COVER STRUCTURE MOUNTING METHOD

(75) Inventor: Masaaki Sasaki, Osaka (JP)

(73) Assignee: Panasonic Corporation, Osaka (JP)

( * ) Notice: Subject to any disclaimer, the term of this patent is extended or adjusted under 35 U.S.C. 154(b) by 95 days.

(21) Appl. No.: 12/360,453

(22) Filed: Jan. 27, 2009

(65) Prior Publication Data
US 2009/0190292 A1  Jul. 30, 2009

(30) Foreign Application Priority Data
Jan. 28, 2008  (JP) .................... 2008-016618

(51) Int. Cl.
H05K 5/00 (2006.01)
H05K 7/00 (2006.01)
H04M 1/00 (2006.01)

(52) U.S. Cl. ................. 361/679.01; 455/575.8

(58) Field of Classification Search ............ 220/836; 384/276; 361/679.01, 679.4, 679.45, 679.58; 439/135; 455/575.8; 379/433.11
See application file for complete search history.

(56) References Cited

U.S. PATENT DOCUMENTS
2006/0154520 A1*  7/2006 Gennai et al. ........... 439/578
2007/0165365 A1   7/2007 Kamiya FOREIGN PATENT DOCUMENTS
JP  2002009911 A  *  1/2002
JP  2002-110284 A   4/2002
JP  2005-228756 A   8/2005

* cited by examiner

Primary Examiner — Jayprakash N. Gandhi
Assistant Examiner — Anthony M Haughton
(74) Attorney, Agent, or Firm — Hamre, Schumann, Mueller & Larson, P.C.

(57) ABSTRACT

With a cover structure of the present invention, a cover body includes a cover portion that is large enough to cover a terminal portion and a shaft portion whose one end is connected to the cover portion and whose cross section is oval, a casing includes a bearing portion in which the shaft portion is fitted loosely, and the bearing portion has a inner diameter larger than a shaft diameter of a major diameter portion of the shaft portion and includes an opening portion that is larger than a shaft diameter of a minor diameter portion of the shaft portion and smaller than the shaft diameter of the major diameter portion. With this configuration, the cover body can be smoothly shifted from an opened state to a closed state and a portion to be covered can be covered properly. Furthermore, the assembling workability of the cover structure can be improved.

13 Claims, 13 Drawing Sheets

COVER STRUCTURE, ELECTRONIC EQUIPMENT AND COVER STRUCTURE MOUNTING METHOD

BACKGROUND OF THE INVENTION

1. Field of the Invention

The present invention relates to a cover structure that can cover a portion to be covered containing terminals and the like that are mounted onto various electronic equipment such as a digital camera. Furthermore, the present invention relates to a method for mounting the cover structure onto an electronic device.

2. Description of Related Art

Imaging devices such as a digital camera and a video camera are provided with various terminals such as a power supply terminal that can be connected to an AC adapter for supplying commercial power and a communication terminal that makes communication possible by being connected to other electronic equipment such as a personal computer via a cable. Many of these terminals can be covered with a cover body since a malfunction may occur if extraneous substances such as dust become attached.

Generally, as for the configurations of a cover structure, there are a cover structure in which the cover body completely separates from the electronic equipment when the cover body is in a state where terminals are exposed (opened state) and a cover structure in which a part of the cover body is connected to the electronic equipment in the opened state. JP 2002-110284 A and JP 2005-228756 A disclose cover structures in which a part of a cover body is connected to the electronic equipment in the opened state.

FIG. 7A is a perspective view of a conventional digital camera. A digital camera 101 shown in FIG. 7A is an example of electronic equipment. The digital camera 101 is provided with a release button 102, a display portion 103 and a cover body 104. The release button 102 accepts a photographing operation by a user. The display portion 103 can display an image taken with an image sensor. The cover body 104 can cover a terminal portion where, for example, a communication terminal is disposed. When the cover body 104 is in a closed state as shown in FIG. 7A, a user places his/her finger on a projecting portion 141 and pulls in the direction indicated by an arrow A. Consequently, the closed state can be shifted to a state where a cover portion 144 and a casing 111 (described below) are disengaged (not shown). The cover body 104 is retained on the digital camera 101 via a shaft portion 142. Next, by rotating the cover body 104 for example, approximately 90 degrees about a shaft portion 142 as an axis, the state can be shifted to the opened state where terminals are exposed (not shown). When the cover body 104 is shifted from the opened state to the closed state as shown in FIG. 7A, a lug portion 145a formed on the top of a cover portion 144 (described below with reference to FIG. 9A) is engaged with an engaged portion of the casing 111 (not shown). Next, a lug portion 145b formed on the bottom of the cover portion 144 (described below with reference to FIG. 9A) is engaged with an engaged portion of the casing 111 (not shown).

When the cover body 104 is shifted from the opened state to the closed state, the operation is generally performed based on the above procedure. However, the closing operation is not always performed based on the above procedure. For example, there is a case where a user tries to close the cover body 104 by engaging the lug portion 145b formed on the bottom of the cover portion 144 (see FIG. 9A) with the engaged portion of the casing 11 first. FIG. 7B shows a state where the lug portion 145b is engaged with the engaged portion of the casing 111. It is possible to shift from this state to the closed state by pressing the cover portion 144 in the direction indicated by an arrow B. However, when such a closing procedure is taken, the shaft portion 142 comes into contact with a part of the casing 111, and as a result, the cover body 104 may not be closed smoothly.

FIG. 8A is a cross-sectional view of a line U-U in FIG. 7B. FIG. 8B is a cross-sectional view of a line V-V in FIG. 8A. FIG. 8C is a cross-sectional view of a line W-W in FIG. 8A. FIG. 9A is a perspective view of a back side of the cover body 104. FIG. 9B is a perspective view of relevant parts showing a configuration of an end portion 143 and its vicinity.

As shown in FIGS. 8A to 8C, the casing 111 of the digital camera 101 is provided with an opening portion 112, an opening portion 113 and a bearing portion 114. The opening portion 112, for example, exposes a communication terminal. The bearing portion 114 is formed with a circular arc of constant curvature and is able to hold the shaft portion 142. The opening portion 113 is formed in order to connect the bearing portion 114 to the outside.

As shown in FIGS. 9A and 9B, on the back of the cover body 104, the shaft portion 142 is provided standing in a substantially perpendicular direction relative to that back surface. A cross-section shape of the shaft portion 142 is formed to be a perfect circle as shown in FIG. 9B. The shaft portion 142 is fitted loosely in the bearing portion 114 so as to be movable in its axial direction, and accordingly, a shaft diameter f is made slightly smaller than an inner diameter e of the bearing portion 114. At the end of the shaft portion 142, an end portion 143 having a shaft diameter whose size is larger than the shaft diameter f of the shaft portion 142 is formed integrally.

FIG. 10A is a cross-sectional view of the cover body 104 in the closed state. FIG. 10B is a cross-sectional view of the cover body 104 in the state as shown in FIG. 7B.

However, with the above conventional configuration, there are no ways to restrict the shaft portion 142 loosely fitted in the bearing portion 114 from moving in the direction of the opening portion 113. Thus, when the cover body 104 is to be closed by being pressed in the direction indicated by the arrow B from a state as shown in FIG. 10B, an end of the shaft portion 142 faces obliquely upward, and consequently, the end portion 143 may come into contact with a surface 111a that is a part of the opening portion 113. If the end portion 143 comes into contact with the surface 111a, the cover body 104 comes to a halt in a position between the opened and closed state, and a terminal portion 115 cannot be covered properly with the cover body 104. Furthermore, in a state where the end portion 143 is in contact with the surface 111a, if excessive force is exerted onto the cover body 104 in a closing direction, the shaft portion 142 may be deformed and damaged.

SUMMARY OF THE INVENTION

Therefore, with the foregoing in mind, it is an object of the present invention to provide a cover structure with which a state of a cover body can be shifted smoothly from an opened state to a closed state, and opening/closing operability can be improved. Furthermore, the present invention relates to a mounting method that improves assembling workability for such a cover structure.

The cover structure of the present invention includes a cover portion that covers a part of a casing, a shaft portion that is provided to the cover portion, a bearing portion that is provided for the casing and an opening portion that is provided for the bearing portion. A cross section of the shaft portion has shaft diameters with a plurality of lengths. The largest shaft diameter of the shaft diameters of the cross section of the shaft portion is larger than an inner diameter of the opening portion and smaller than an inner diameter of the bearing portion, and the smallest shaft diameter of the shaft diameters of the cross section of the shaft portion is smaller than the inner diameter of the opening portion.

The mounting method of the present invention is for the cover structure including a cover portion that covers a part of a casing, a shaft portion that is provided to the cover portion, a bearing portion that is provided to the casing and an opening portion that is provided to the bearing portion. With the cover structure, a cross section of the shaft portion has shaft diameters with a plurality of lengths, the largest shaft diameter of the shaft diameters of the cross section of the shaft portion is larger than an inner diameter of the opening portion and smaller than an inner diameter of the bearing portion, and the smallest shaft diameter of the shaft diameters of the cross section of the shaft portion is smaller than the inner diameter of the opening portion. Furthermore, the method includes inserting the shaft portion into the bearing portion via the opening portion in the direction with smaller than the inner diameter shaft diameter of the shaft diameters of its cross section and rotating the cover portion about the shaft portion as an axis such that the cover portion is in a position where the direction of the largest shaft diameter of the shaft diameters of the cross section of the shaft portion is substantially perpendicular to the direction of movement of the shaft portion in the opening portion.

According to the present invention, a state of the cover body can be shifted smoothly from an opened to a closed state, and opening/closing operability can be improved. Furthermore, assembling workability for the cover structure can be improved.

DETAILED DESCRIPTION OF THE INVENTION

Hereinafter, the present invention will be described by way of illustrative embodiments with reference to the drawings.

Embodiment

[1. Configuration of Electronic Equipment]

Figure 1A:
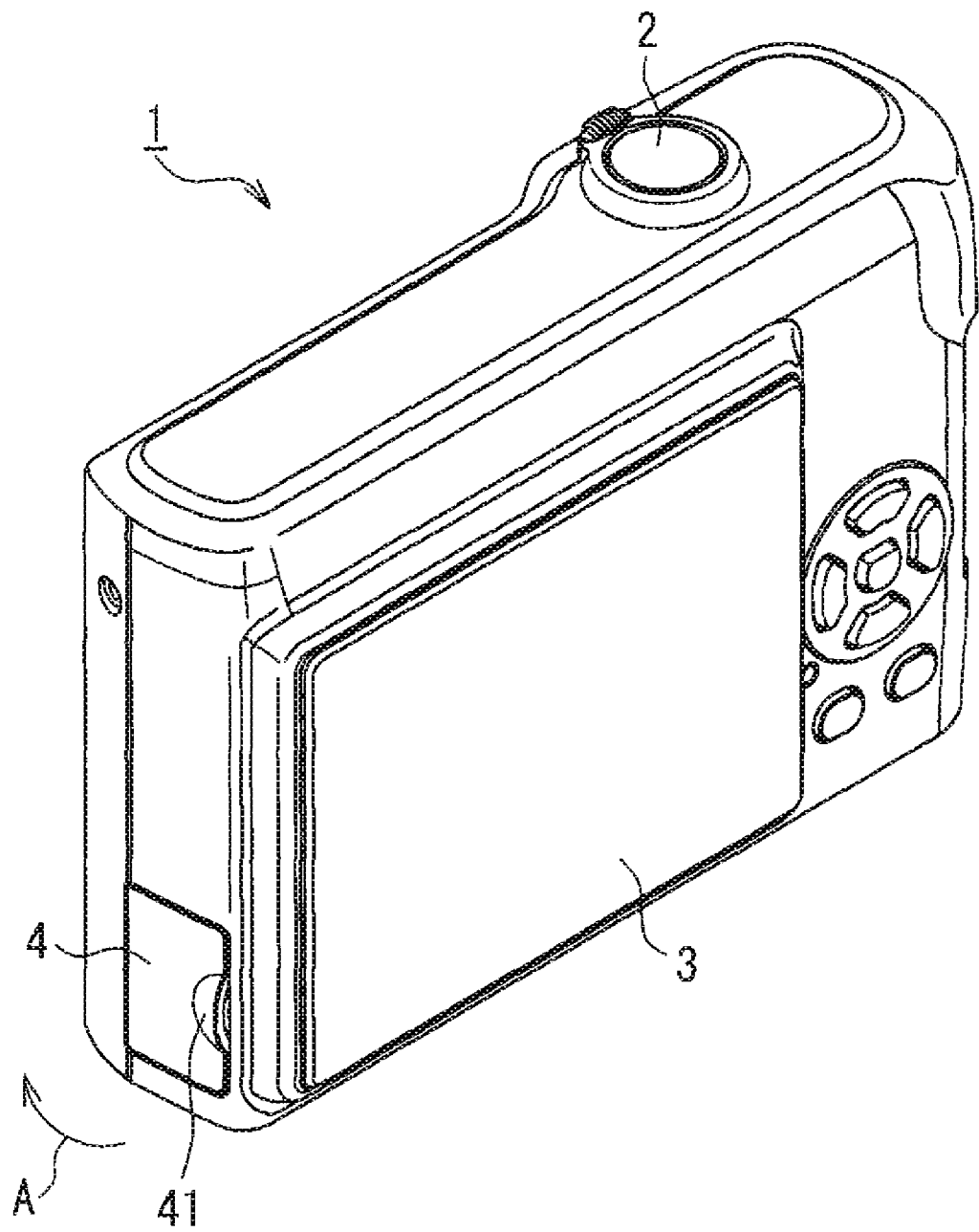
FIG. 1A is a perspective view showing an external appearance of an electronic device according to an embodiment.
Figure 1B:
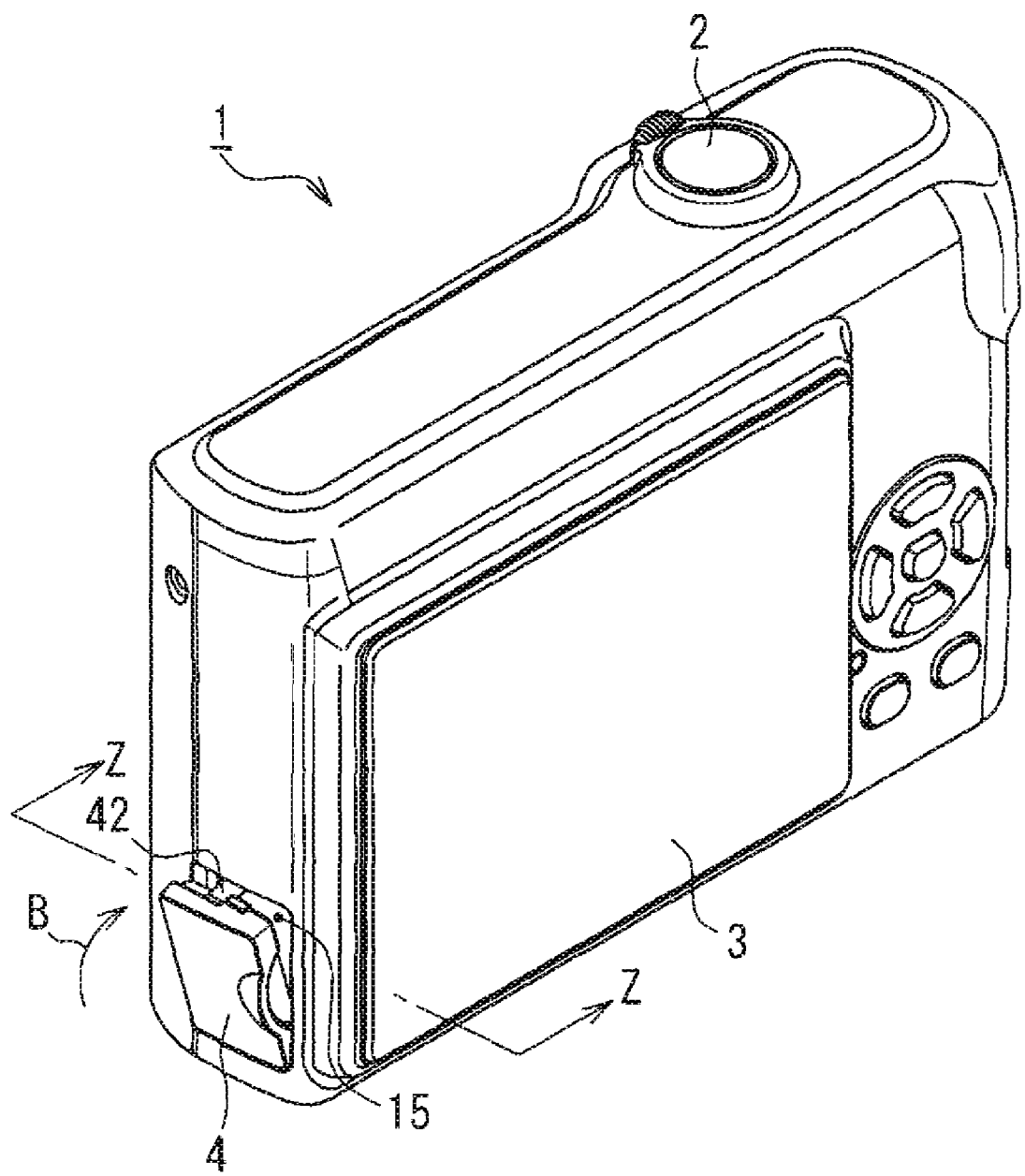
FIG. 1B is a perspective view showing an external appearance of an electronic device according to an embodiment.

FIGS. 1A and 1B are perspective views of a digital camera that is an example of electronic equipment according to a present embodiment. FIG. 1A shows a state where a cover body 4 is closed (closed state). FIG. 1B shows a state where the bottom of the cover body 4 is engaged with a casing 11. Note that an "opened state" according to the present embodiment indicates that a terminal portion 15 is completely exposed (not shown). Additionally, in the present embodiment, the terminal portion 15 is exemplified as a portion to be covered that can be covered with the cover body 4; however, the portion to be covered is not limited to a terminal.

A digital camera 1 is provided with a release button 2, a display portion 3 and the cover body 4. The release button 2 can accept a photographing command from a user. The display portion 3 can display an image taken with an image sensor (not shown). The cover body 4 can cover a terminal portion where, for example, a communication terminal is disposed. Note that in the present embodiment, a digital camera is taken as an example of electronic equipment; however, not only a digital camera but also a device provided with at least various terminals such as a power supply terminal or an external connection terminal and a cover body capable of covering those terminals is usable. The present invention is particularly useful in, for example, mobile electronic equipment such as a video camera, a cell phone unit and the like, in addition to a digital camera.

When the cover body 4 is in a closed state as shown in FIG. 1A, a user places his/her finger on a projecting portion 41 and pulls in the direction indicated by an arrow A. Then the terminal portion 15 is exposed by rotating the cover body 4 approximately 90 degrees about a shaft portion 42 as an axis, and a state can be obtained in which a cable and the like can be connected to the terminal portion 15. When the cover body 4 is shifted to the closed state as shown in FIG. 1A, first, a lug portion 45a formed on the top of a cover portion 44 (described below with reference to FIG. 3A) is engaged with an engaged portion of the casing 11. Next, a lug portion 45b formed on the bottom of the cover portion 44 (described below with reference to FIG. 3A) is engaged with an engaged portion of the casing 11. Note that a specific configuration of the cover body 4 will be described below.

When shifting the cover body 4 from the opened state to the closed state, the operation generally is performed based on the above procedure. However, closing operation is not always performed based on the above procedure. For example, there is a case where a user tries to close the cover body 4 by engaging the lug portion 45b with the engaged portion of the casing 11 first. FIG. 1B shows a state where the lug portion 45b is engaged with the engaged portion of the casing 11. It is possible to shift from this state to the closed state by pressing the cover portion 44 in the direction indicated by an arrow B.

[2. Configuration of Cover Structure]

Considered broadly, a cover structure of the present embodiment is constituted of the casing 11 and the cover body 4. A specific configuration will be described below.

Figure 2A:
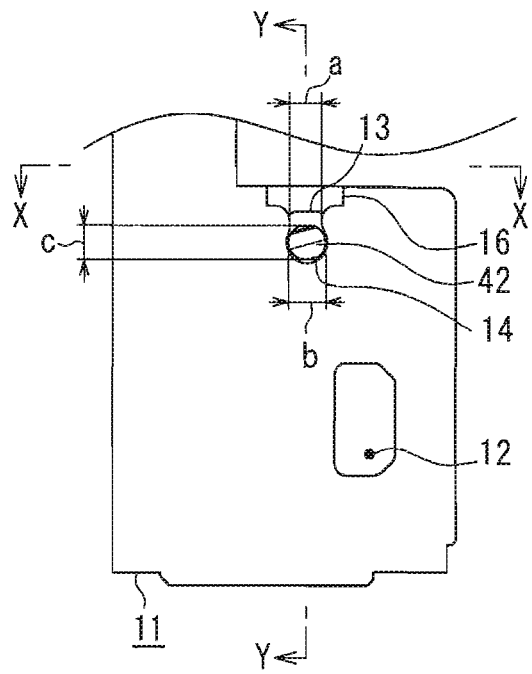
FIG. 2A is a cross-sectional view of a line Z-Z in FIG. 1B.
Figure 2B:
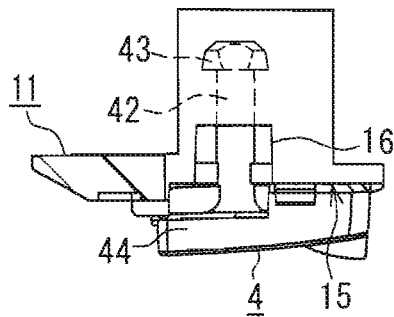
FIG. 2B is a cross-sectional view of a line X-X in FIG. 2A.
Figure 2C:
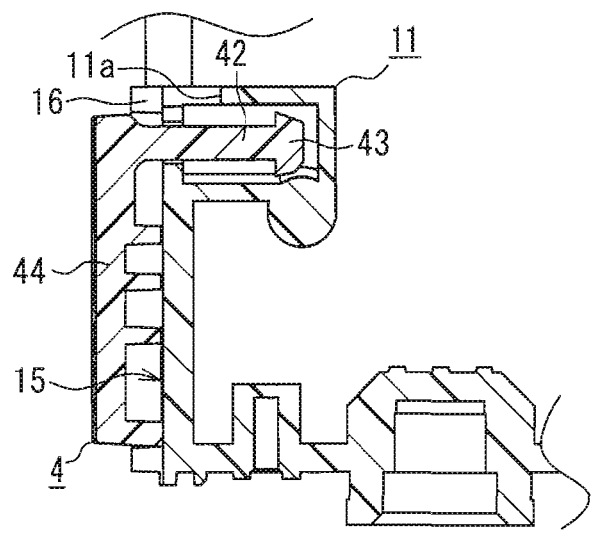
FIG. 2C is a cross-sectional view of a line Y-Y in FIG. 2A.
Figure 3A:
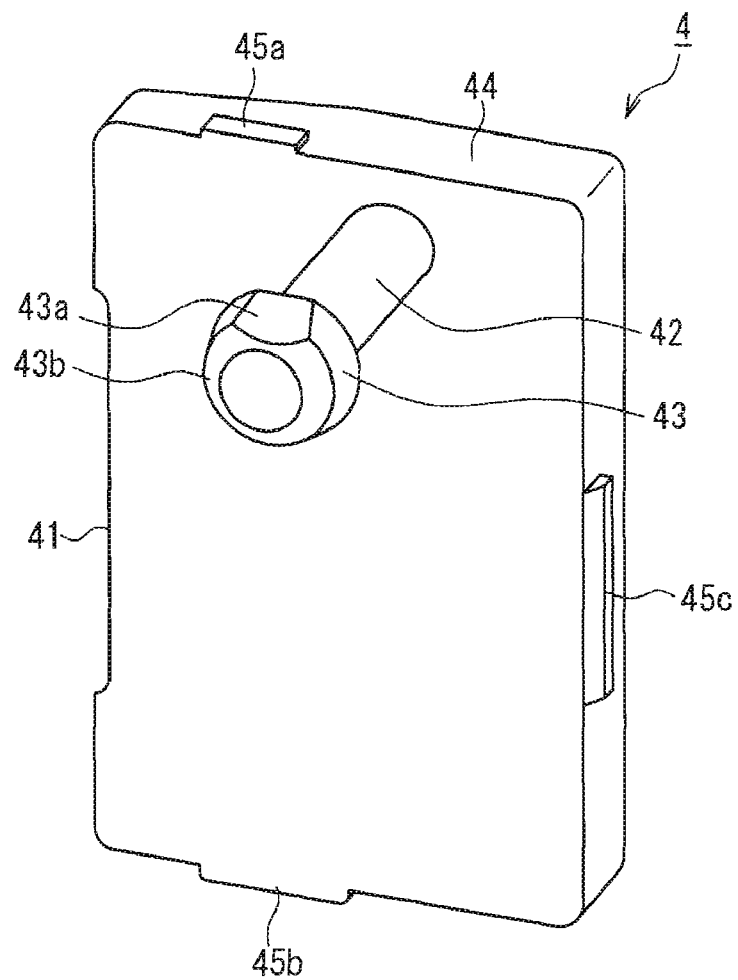
FIG. 3A is a perspective view of a cover body.
Figure 3B:
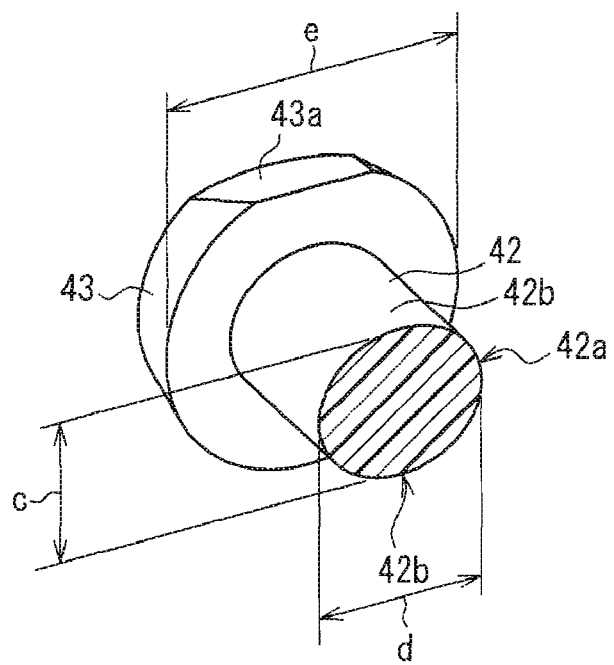
FIG. 3B is a perspective view of parts near an end portion.

FIG. 2A is a cross-sectional view of a line Z-Z in FIG. 1B. FIG. 2B is a cross-sectional view of a line X-X in FIG. 2A. FIG. 2C is a cross-sectional view of a line Y-Y in FIG. 2A. FIG. 3A is a perspective view of a back side of the cover body 4. FIG. 3B is a perspective view of relevant parts showing a configuration of an end portion 43 and its vicinity.

As shown in FIGS. 2A to 2C, the casing 11 of the digital camera 1 is provided with an opening portion 12, an opening portion 13, a bearing portion 14, the terminal portion 15 and an opening portion 16. The opening portion 12, for example, exposes a communication terminal. The opening portion 13 is formed in order to connect the bearing portion 14 to the outside. The bearing portion 14 includes a circular arc of a constant curvature and enables the shaft portion 42 to be loosely fitted. The terminal portion 15 is a region where the opening portion 12 is formed. The bearing portion 14 has an internal circumference circular arc surface that faces a circumference cylindrical surface of the shaft portion 42 loosely fitted in with a minute gap.

Furthermore, as shown in FIGS. 3A and 3B, on the back of the cover body 4, the shaft portion 42 that is substantially cylindrical is provided standing in a substantially perpendicular direction relative to that back surface. According to the present embodiment, a cross-section shape of the shaft portion 42 is, as shown in a hatched portion of FIG. 3B, formed to be substantially elliptic. Specifically, the shaft portion 42 includes a minor diameter portion having a shaft diameter size "c" and a major diameter portion having a shaft diameter size "d" that is larger than the shaft diameter size "c". That is, a cylinder surface of the shaft portion 42 includes a pair of first cylinder surfaces 42a with a smaller curvature radius and a pair of second cylinder surfaces 42b with a larger curvature radius than that of the first cylinder surface 42a. The shaft portion 42 is loosely fitted in the bearing portion 14 so as to be movable in its axial direction, and accordingly, the shaft diameter size "c" is made slightly smaller than an inner diameter size b of the bearing portion 14. At the end of the shaft portion 42, the end portion 43 having an outer diameter size "e" that is larger than the shaft diameter size "d" of the shaft portion 42 is integrally formed. Moreover, the direction of the major diameter of the shaft portion 42 is made substantially parallel to the direction of a short side of the cover portion 44.

The end portion 43 is provided so as to prevent the cover body 4 from coming off from the casing 11. That is, because the outer diameter size "e" of the end portion 43 is made larger than the inner diameter size "b" (see FIG. 2A) of the bearing portion 14, even when the shaft portion 42 moves in the axial direction, the end portion 43 can prevent the shaft portion 42 from coming off the bearing portion 14. Furthermore, a first taper portion 43a is formed on the top of the end portion 43. Additionally, a second taper portion 43b is formed along the perimeter of the end surface in the axial direction of the end portion 43. Thus, by providing both of or either one of the first taper portion 43a and the second taper portion 43b, when shifting the cover body 4 from the opened state to the closed state, particularly when shifting from the state as shown in FIG. 1B to the state as shown in FIG. 1A, the end portion 43 can be prevented from coming into contact with a surface 11a of the casing 11.

The cover portion 44 is large enough to cover the terminal portion 15. Furthermore, the cover portion 44 is provided with lug portions 45a to 45c on a second side and third side, respectively, that are adjacent to a first side where the projecting portion 41 is formed and a fourth side opposite the first side. When the cover body 4 is in the closed state, the lug portions 45a to 45c are engaged with the engaged portion (not shown) formed on the casing 11, and accordingly, the closed state of the cover body 4 can be maintained.

Here, the relationship between an inner diameter size "a" of the opening portion 13 and the inner diameter size "b" of the bearing portion 14 is:

$$a<b$$

In addition, the relationship between the inner diameter sizes "a", "b" and the shaft diameter size "d" of the major diameter portion of the shaft portion 42 is:

$$a<d<b$$

Thus, when the cover body 4 is in a state as shown in FIGS. 2A to 2C, the shaft portion 42 loosely fitted in the bearing portion 14 is able to move in its axis direction (unable to come off) and restricted from moving in the shaft diameter direction. Moreover, the relationship between the inner diameter size "a" and the shaft diameter size "c" of the minor diameter portion is:

$$c<a$$

Thus, when the cover body 4 is mounted onto the casing 11, the shaft portion 42 can move inside the opening portion 13 and reach the bearing portion 14, and as a result, assembling workability is not impaired.

Hereinafter, opening/closing operation will be described.

Figure 4A:
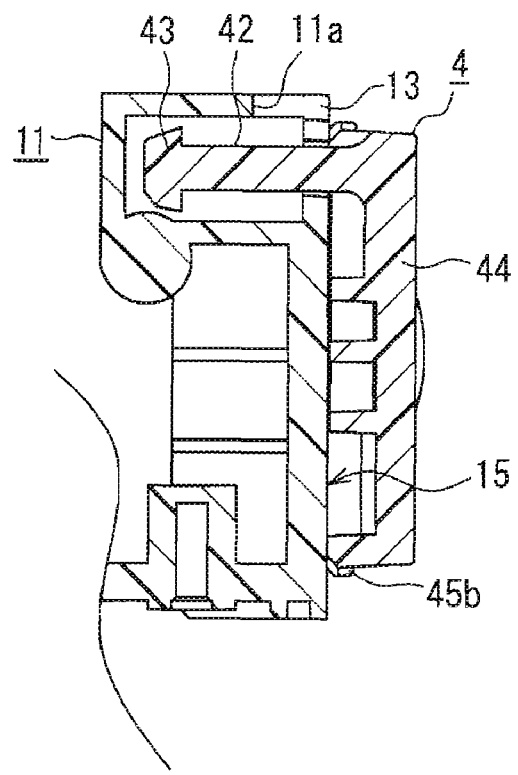
FIG. 4A is a cross-sectional view of a cover body in a closed state.
Figure 4B:
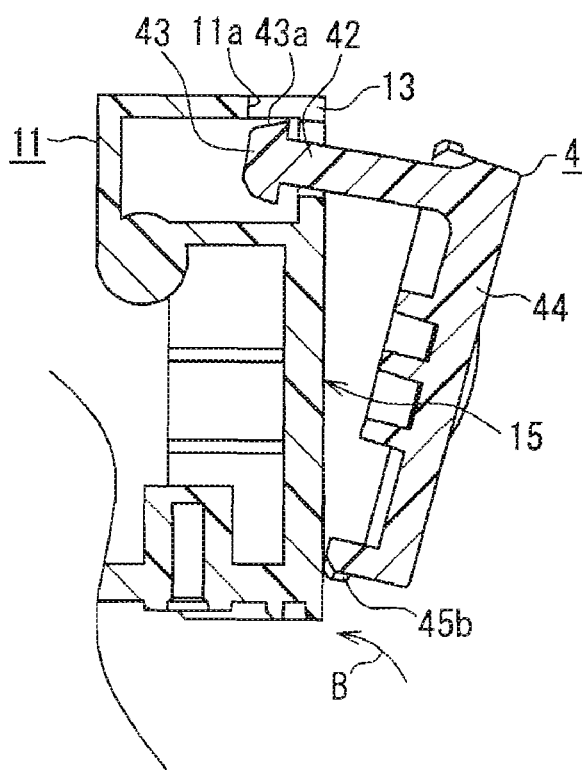
FIG. 4B is a cross-sectional view in a state where a lug portion formed on a bottom of a cover body is engaged with a casing.

FIG. 4A is a cross-sectional view of the cover body 4 in the closed state. FIG. 4B is a cross-sectional view of the cover body 4 in the state as shown in FIG. 1B.

First, in the closed state as shown in FIG. 4A, when a user pulls the cover body 4 in the direction indicated by the arrow A, the lug portions 45a to 45c formed on the cover portion 44 become disengaged from the engaged portions (not shown) of the casing 11. Even when the lug portions 45a to 45c become disengaged from the engaged portions, since the outer diameter of the end portion 43 is larger than the inner diameter of the bearing portion 14, the cover body 4 is prevented from coming off the casing 11. Besides, disengagement of an engaged state of the lug portions 45a to 45c with the engaged portions (not shown) of the casing 11 allows the cover body 4 to rotate freely about the shaft portion 42 as an axis. This enables the cover portion 44 to rotate until it comes to a position where the terminal portion 15 is exposed and a communication terminal disposed on the terminal portion 15 is in a state where a cable can be connected thereto or disconnected therefrom.

Next, as shown in FIG. 4B, when covering the terminal portion 15 from the state where the lug portion 45b is engaged with the engaged portion, the cover body 4 is moved in the direction indicated by the arrow B from the state as shown in FIG. 4B. At this time, since the cross-section shape of the shaft portion 42 is substantially elliptic, the shaft portion 42 does not move in the direction of the opening portion 13 from the bearing portion 14, being restricted from moving in the shaft diameter direction. Thus, when moving the cover body 4 in the direction indicated by the arrow B from the state as shown in FIG. 4B, the end portion 43 can be prevented from moving in the upward direction of FIG. 4B. For that reason, a gap can be formed between the end portion 43 and the surface 11a of the casing 11, and the end portion 43 can be prevented from coming into contact with the surface 11a of the casing 11. Furthermore, since the first taper portion 43a and the second taper portion 43b are formed on the end portion 43, the gap between the end portion 43 and the surface 11a can be made even larger.

By engaging the three lug portions 45a to 45c formed on the sides of the cover portion 44 with the engaged portions of the casing 11 respectively, the cover body 4 can be retained on the casing 11 in a state where the terminal portion 15 is covered with the cover portion 44.

[3. Cover Structure Mounting Method]

Figure 5A:
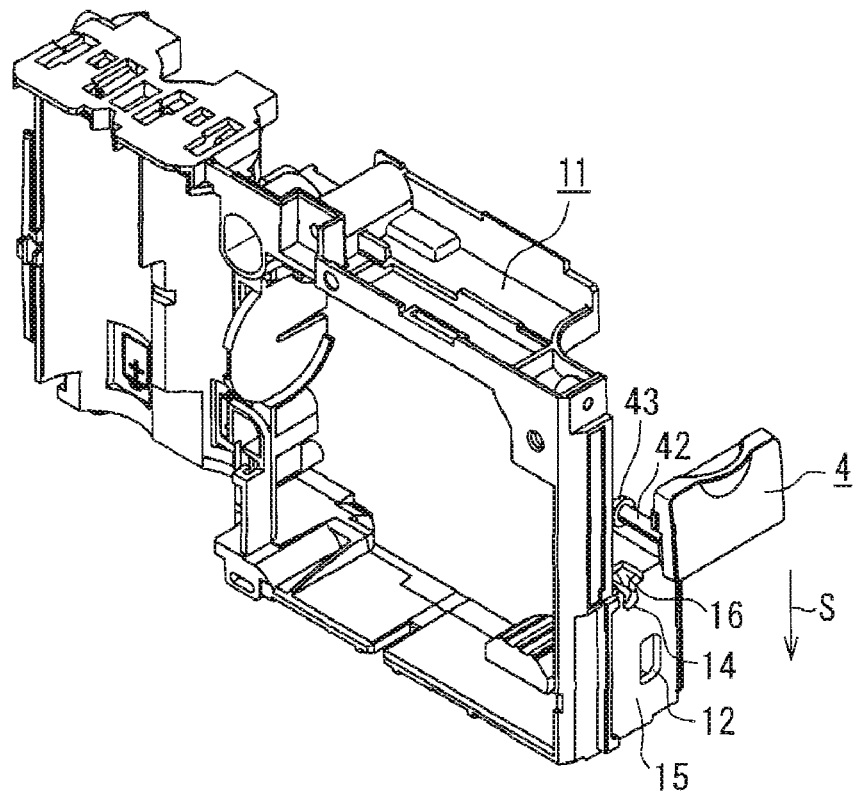
FIG. 5A is a perspective view showing a mounting process of a cover structure.
Figure 5B:
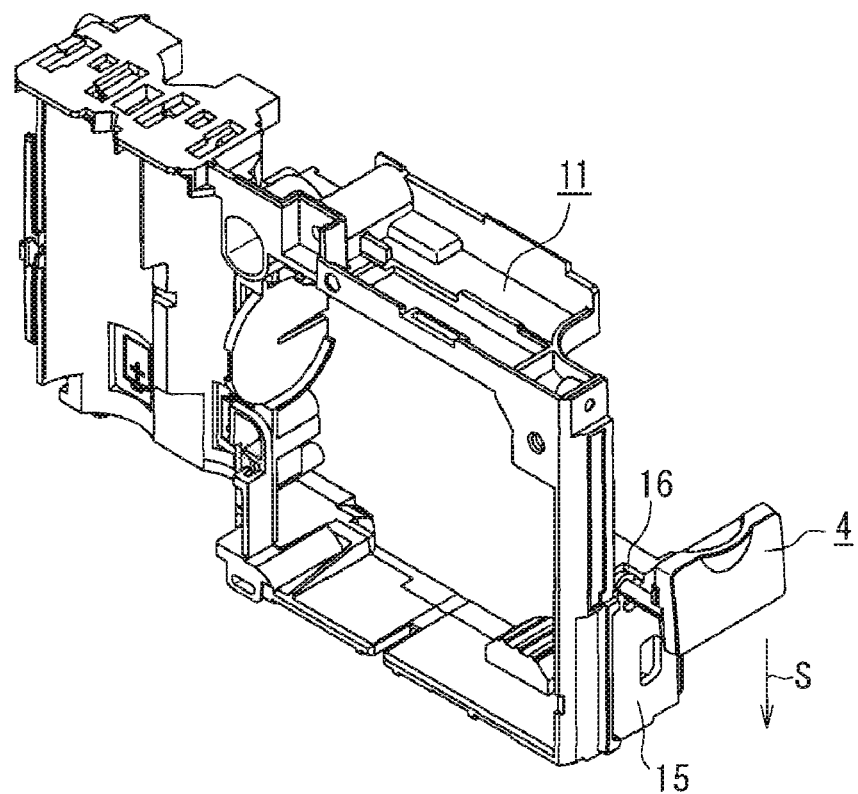
FIG. 5B is a perspective view showing a mounting process of a cover structure.
Figure 5C:
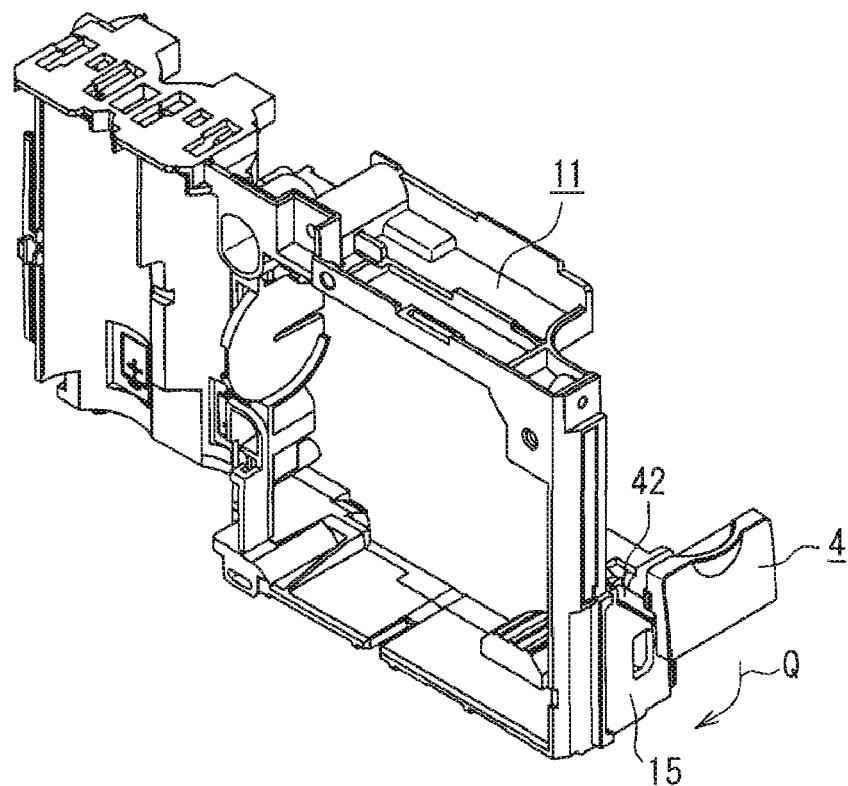
FIG. 5C is a perspective view showing a mounting process of a cover structure.
Figure 5D:
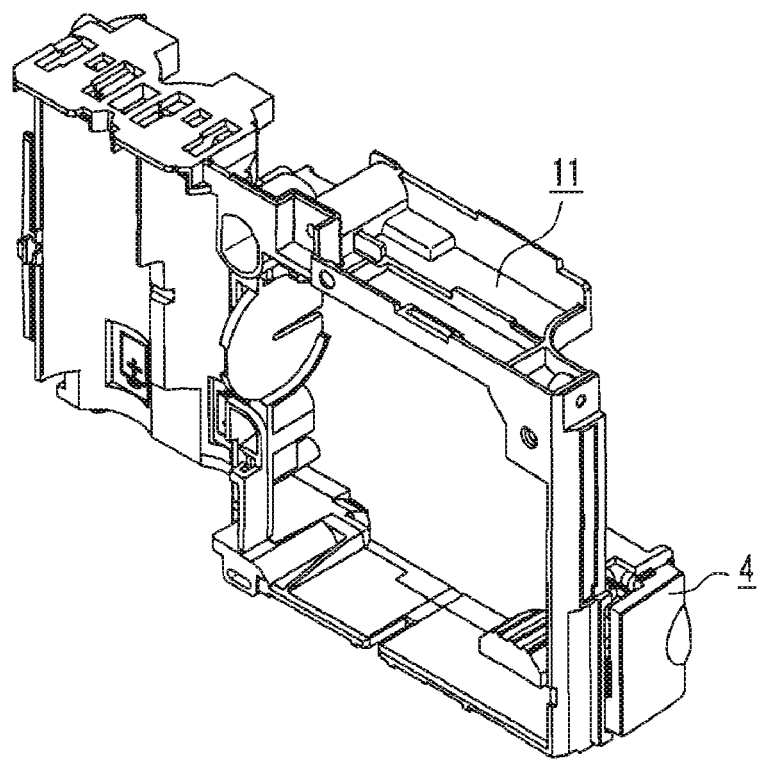
FIG. 5D is a perspective view showing a mounting process of a cover structure.
Figure 6A:
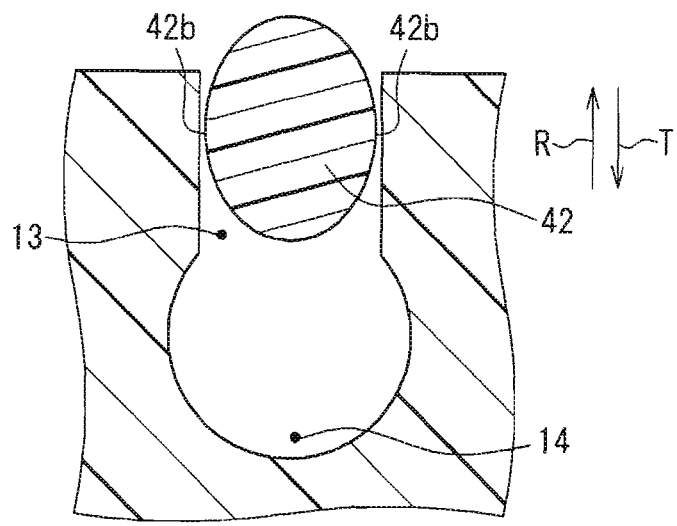
FIG. 6A is a cross-sectional view of relevant parts near a bearing portion.
Figure 6B:
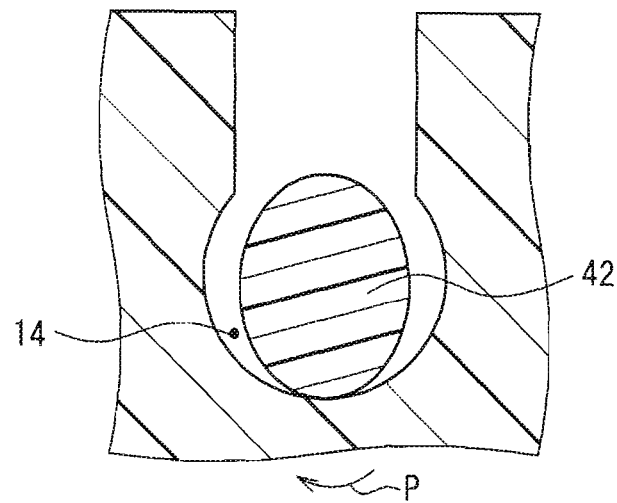
FIG. 6B is a cross-sectional view of relevant parts near a bearing portion.
Figure 6C:
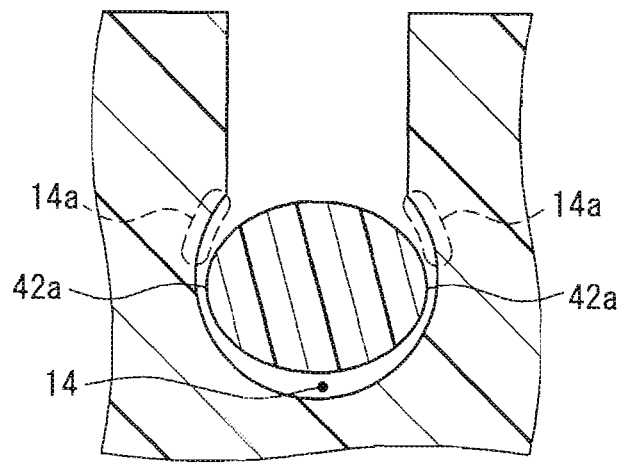
FIG. 6C is a cross-sectional view of relevant parts near a bearing portion.
Figure 7A:
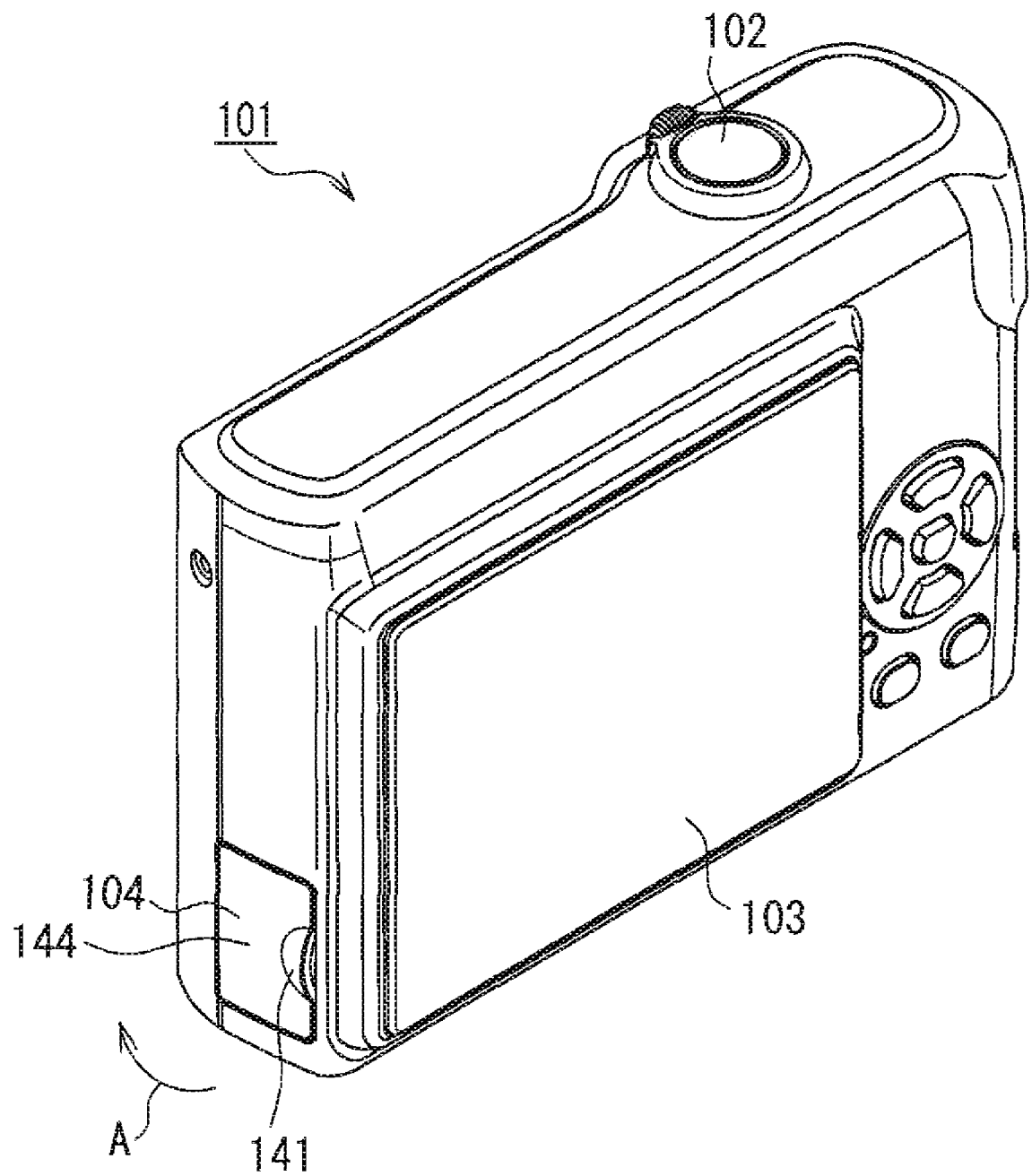
FIG. 7A is a perspective view of a conventional electronic device.
Figure 7B:
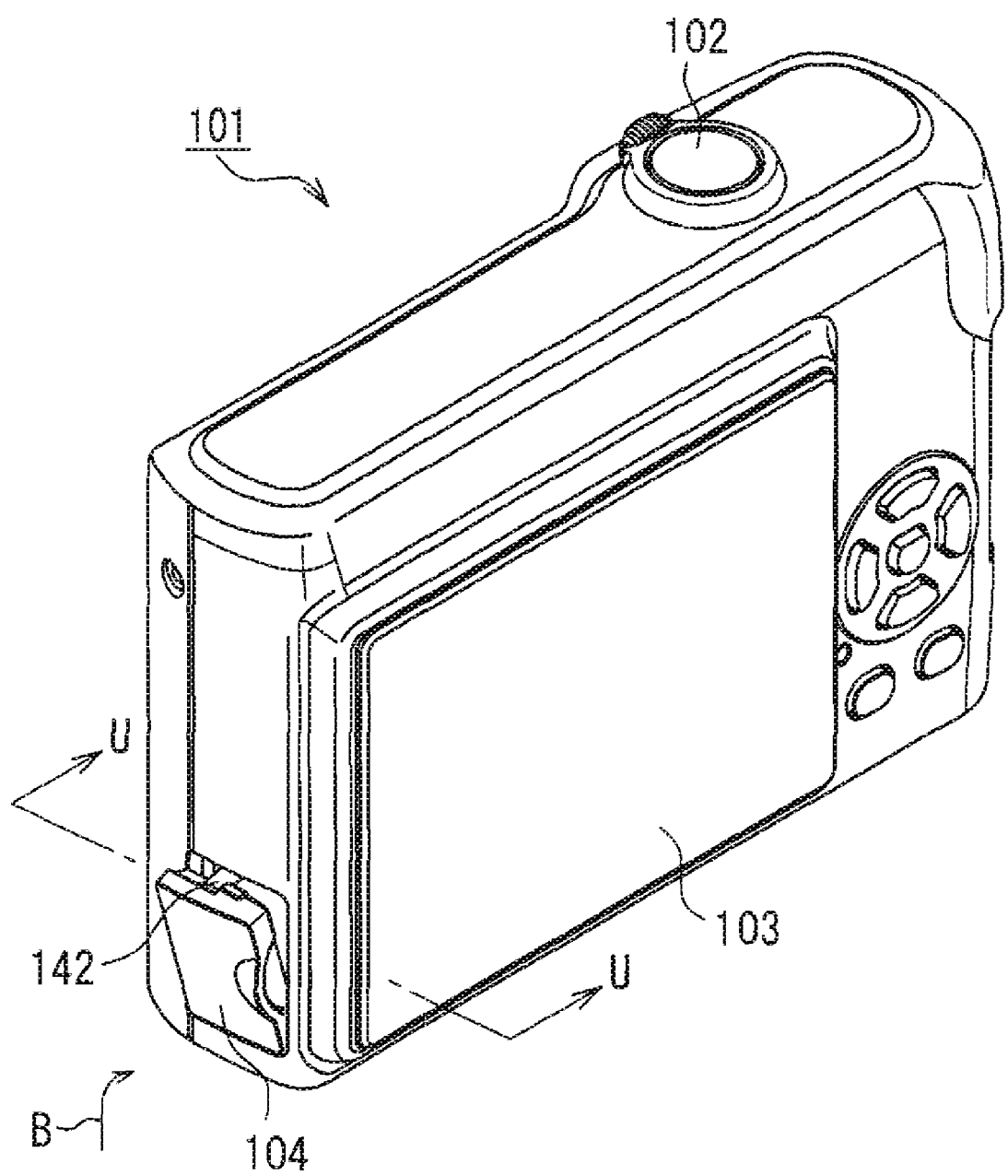
FIG. 7B is a perspective view of a conventional electronic device.
Figure 8A:
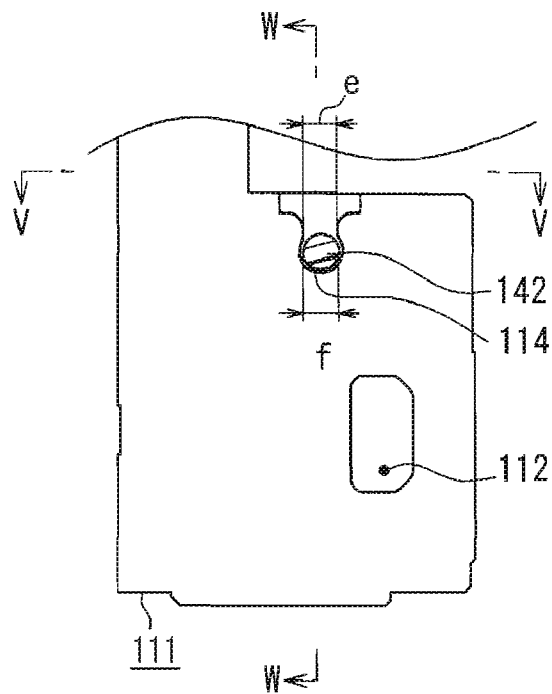
FIG. 8A is a cross-sectional view of a line U-U in FIG. 7B.
Figure 8B:
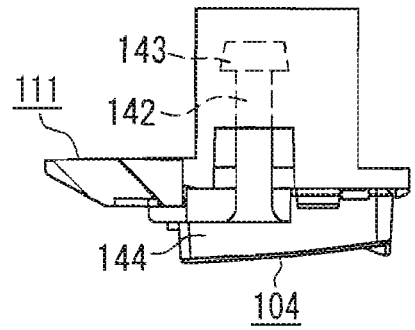
FIG. 8B is a cross-sectional view of a line V-V in FIG. 8A.
Figure 8C:
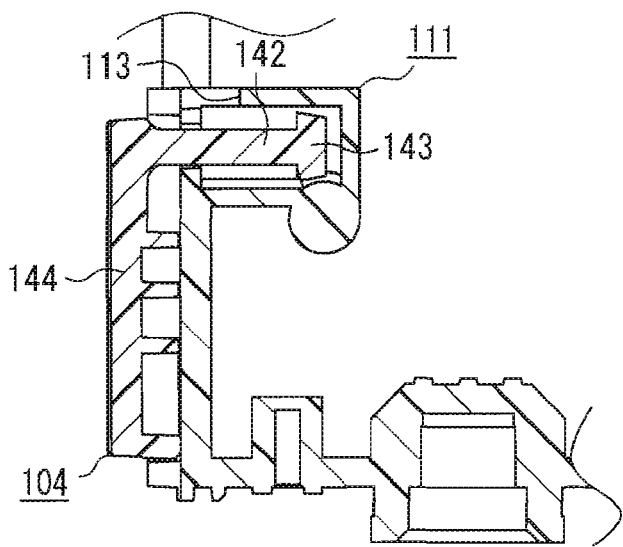
FIG. 8C is a cross-sectional view of a line W-W in FIG. 8A.
Figure 9A:
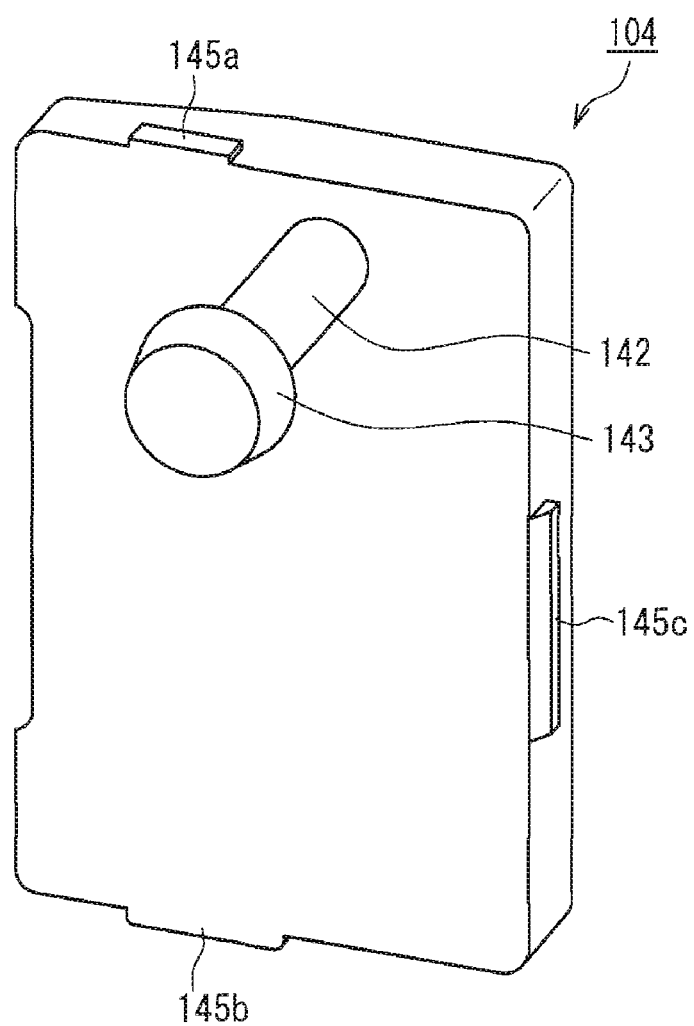
FIG. 9A is a perspective view of a cover body.
Figure 9B:
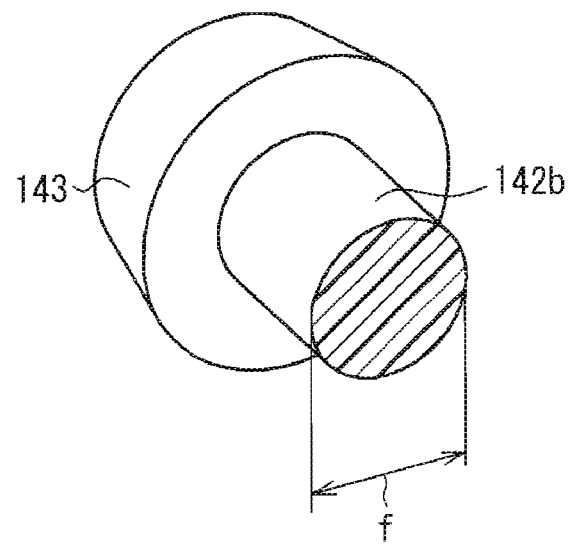
FIG. 9B is a perspective view of parts near an end portion.
Figure 10A:
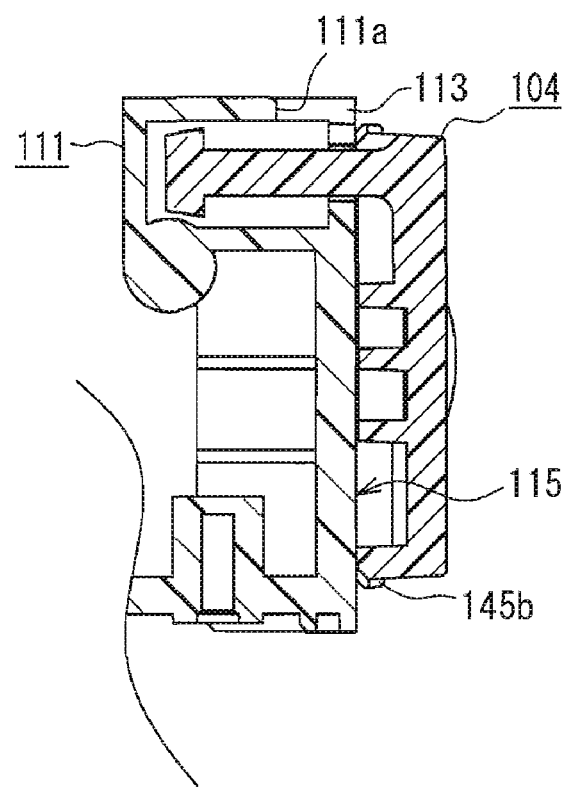
FIG. 10A is a cross-sectional view of a cover body in a closed state.
Figure 10B:
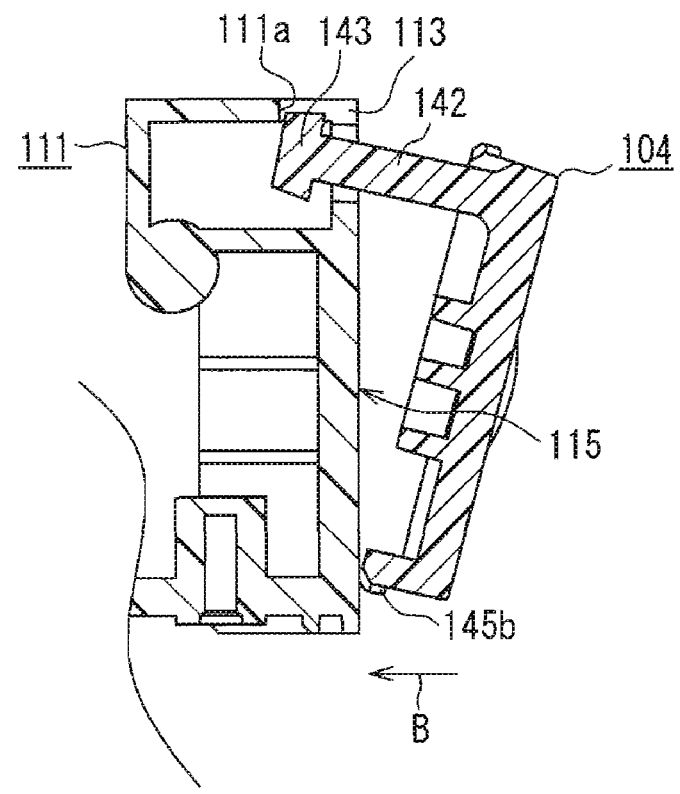
FIG. 10B is a cross-sectional view in a state where a lug portion formed on a bottom of a cover body is engaged with a casing.

FIGS. 5A to 5D are perspective views of the cover body 4 and the casing 11 and show the steps of mounting the cover body 4 onto the casing 11. FIGS. 6A to 6C show a state of the shaft portion 42 corresponding to each state as shown in FIGS. 5B to 5D.

First, as shown in FIG. 5A, the casing 11 is in an erect position, and the cover body 4 is in a substantially horizontal position relative to its long side portion. With the position shown in FIG. 5A being maintained, the cover body 4 is moved in the direction indicated by an arrow S.

FIG. 5B shows a state where the end portion 43 is inserted into the opening portion 16, and the shaft portion 42 is inserted into the opening portion 13. FIG. 6A shows a positional relationship between the shaft portion 42 and the opening portion 13 that are in the state as shown in FIG. 5B. In a state as shown in FIG. 6A, the second cylinder surfaces 42b of the shaft portion 42 are facing the inside of the opening portion 13. In addition, since there is a gap between the second cylinder surfaces 42b and the inside of the opening portion 13, the shaft portion 42 is movable in the directions indicated by arrows T and R. If the cover body 4 is moved in the direction indicated by the arrow S, with the position shown in FIG. 5B being maintained, the shaft portion 42 reaches the bearing portion 14.

FIG. 5C shows a state where the shaft portion 42 is inserted into the bearing portion 14. FIG. 6B shows a positional relationship between the shaft portion 42 and the bearing portion 14 in the state as shown in FIG. 5C. In a state as shown in FIG. 6B, the shaft portion 42 has been moved only in the direction indicated by the arrow T from the state as shown in FIG. 6A, thus the shaft portion 42 is movable in the direction indicated by the arrow R.

If the cover body 4 is rotated approximately 90 degrees about the shaft portion 42 as an axis in the direction indicated by an arrow Q from the state as shown in FIG. 5C, the state will become that shown in FIG. 5D. The state as shown in FIG. 5D is a state where the cover portion 44 faces the terminal portion 15. FIG. 6C shows a positional relationship between the shaft portion 42, the opening portion 13 and the bearing portion 14 in the state as shown in FIG. 5D. In the state as shown in FIG. 6C, the first cylinder surfaces 42a of the shaft portion 42 are closely facing the inside of the bearing portion 14. In the state as shown in FIG. 6C, a relationship between the inner diameter size "a" of the opening portion 13, the inner diameter size "b" of the bearing portion 14 and the shaft diameter size "d" of the major diameter portion of the shaft portion 42 is:

$$a<d<b$$

As a result, even when the shaft portion 42 is to move in the direction indicated by the arrow R, the shaft portion 42 comes into contact with restriction portions 14a, thereby being restricted from moving in the direction of the opening portion 13.

In the present embodiment, an inside portion of the bearing portion 14 near to the opening portion 13 is used as a restriction portion 14a. The restriction portion 14a is a part with which the circumference cylindrical surface of the shaft portion 42 comes into contact and that restricts the shaft portion 42 from moving in the direction of the opening portion 13 when the shaft portion 42 moves in the direction of the opening portion 13.

Note that, although parts of the inside of the bearing portion 14 are indicated as the restriction portions 14a in FIG. 6c. But the inside other than the restriction portions 14a also can restrict the shaft portion 42 from moving in the shaft diameter direction, thus there are cases where the inside other than the restriction portions 14a is also included in the restriction portions 14a.

[4. Effect of Embodiment, Etc.]

According to the present embodiment, by making the cross-section shape of the shaft portion 42 of the cover body 4 substantially elliptic, and moreover, by making the relationship between the inner diameter size "a" of the opening portion 13, the inner diameter size "b" of the bearing portion 14 and the shaft diameter size "d" of the major diameter portion of the shaft portion 42.

$$a<d<b$$

The shaft portion 42 loosely fitted in the bearing portion 14 is restricted from moving in a direction that would allow it to come off (direction of the opening portion 13). Consequently, when shifting the cover body 4 from the opened state to the closed state (particularly, shifting the cover body 4 from the state as shown in FIG. 1B to the state as shown in FIG. 1A), the end portion 43 can be prevented from coming into contact with the surface 11a of the casing 11. Therefore, the cover body 4 can be shifted smoothly to the closed state, and opening/closing operability of the cover body 4 can be improved. Furthermore, since the end portion 43 can be prevented from coming into contact with the surface 11a, damage to the shaft portion 42 and/or the cover body 4 can be prevented.

In addition, when the digital camera 1 is assembled, the shaft portion 42 is inserted in a minor diameter direction of the shaft portion 42 into the opening portion 13. With the cover body 4 being rotated approximately 90 degrees in a state where the shaft portion 42 is positioned in the bearing portion 14, the shaft portion 42 is caused to be fitted loosely into the bearing portion 14. In the present embodiment, by making the cross-section shape of the shaft portion 42 of the cover body 4 substantially elliptic, and moreover, by making the relationship between the inner diameter size "a" of the opening portion 13, the inner diameter size "b" of the bearing portion 14 and the shaft diameter size "d" of the major diameter portion of the shaft portion 42

$$a<d<b,$$

the shaft portion 42 can be loosely fitted into the bearing portion 14 with ease and it can be made difficult for it to come off after loosely fitting. Thus, assembling workability can be improved.

Moreover, by disposing the shaft portion 42 near the end of the cover portion 44 and forming the bearing portion 14 near the upper end of the terminal portion 15 (upper end when the digital camera 1 is in an erect position as shown in FIG. 1A), the opening/closing operability and assembling workability of the cover body 4 can be improved. That is, even when the cover body 4 is in the opened state with the digital camera 1 in an erect position, the cover body 4 will be in a position where the shaft portion 42 is positioned on the upper part due to the actual weight of the cover portion 44. Accordingly, since the position of the cover body 4 does not greatly change in the direction of rotation about the shaft portion 42 in the opened/closed state, opening/closing operation of the cover body 4 can be performed smoothly. Furthermore, since the position of the cover body 4 does not greatly change in the opened/closed state, assembling workability can be improved when the cover body 4 is mounted onto the casing 11.

Note that, although the cross-section shape of the shaft portion 42 is assumed to be substantially elliptic in the present embodiment, if the cross-section shape at least satisfies the conditions below, similar effects to those in the present embodiment can be obtained.

1. The cross section of the shaft portion 42 has shaft diameters with a plurality of lengths.
2. The largest shaft diameter of the shaft diameters of the cross section of the shaft portion 42 is larger than the inner diameter of the opening portion 13 and smaller than the inner diameter of the bearing portion 14.
3. The smallest shaft diameter of the shaft diameters of the cross section of the shaft portion 42 is smaller than the inner diameter of the opening portion 13 (note that the shaft diameter preferably passes through the centroid of the cross section of the shaft portion 42).

For example, the cross-section shape of the shaft portion 42 can be regular hexagonal, and the cross-section shape of the bearing portion 14 can be substantially elliptic. In this case, when assuming that the distance between opposite sides of a cross-section portion of the shaft portion 42 is a1, the inner diameter size of the bearing portion 14 is b1 and the length of the diagonal line of the cross-section portion of the shaft portion 42 is d1, by making their relationship $$a1 < b1 < d1,$$

similar effects to those in the present embodiment can be obtained. Moreover, by making the cross-section shape of the shaft portion 42 substantially elliptic and the cross-section shape of the bearing portion 14 regular hexagonal, similar effects to those in the present embodiment can be obtained. In addition, even when either one of the cross-section shapes of the shaft portion 42 or the bearing portion 14 is elliptic or rectangular, similar effects to those in the present embodiment can be obtained.

Besides, in the present embodiment, although the cover body 4 is formed of resin material having elastomeric properties, the cover body 4 may be formed of material at least capable of elastic deformation. In addition, the entire cover body 4 may be configured to be integrally formed of resin material having elastomeric properties, and even with a configuration in which only the shaft portion 42 is formed of resin material having elastomeric properties while other parts are formed of a hard material, similar effects to those in the present embodiment can be obtained.

[Appendix 1]

The cover structure of the present invention includes a cover portion that covers a part of a casing, a shaft portion that is provided to the cover portion, a bearing portion that is provided to the casing and an opening portion that is provided to the bearing portion. A cross section of the shaft portion has shaft diameters with a plurality of lengths. The largest shaft diameter of the shaft diameters of the cross section of the shaft portion is larger than an inner diameter of the opening portion and smaller than an inner diameter of the bearing portion, and the smallest shaft diameter of the shaft diameters of the cross section of the shaft portion is smaller than the inner diameter of the opening portion.

Electronic equipment of the present invention is electronic equipment including a casing and a cover body that can cover a portion to be covered disposed on the casing. The cover body includes a cover portion that covers a part of the casing, a shaft portion that is provided to the cover portion, a bearing portion that is provided to the casing and an opening portion that is provided to the bearing portion. A cross section of the shaft portion has shaft diameters with a plurality of lengths. The largest shaft diameter of the shaft diameters of the cross section of the shaft portion is larger than an inner diameter of the opening portion, but smaller than an inner diameter of the bearing portion, and the smallest shaft diameter of the shaft diameters of the cross section of the shaft portion is smaller than the inner diameter of the opening portion.

With this configuration, when opening/closing the cover body against the casing, movement in the shaft diameter direction of the shaft portion loosely fitted in the bearing portion can be suppressed. Accordingly, the shaft portion can be prevented from coming into contact with the casing, and opening/closing operation can be smoothly performed.

Note that the casing 11 in the present embodiment is an example of a casing of the present invention. The cover body 4 is also an example of a cover body of the present invention. The cover portion 44 is also an example of a cover portion of the present invention. The shaft portion 42 is also an example of a shaft portion of the present invention. The bearing portion 14 is also an example of a bearing portion of the present invention. The major diameter portion of the shaft portion 42 in the present embodiment is an example of the largest shaft diameter of the shaft diameters of the cross section of the shaft portion of the present invention. The minor diameter portion of the shaft portion 42 in the present embodiment is an example of the smallest shaft diameter of the shaft diameters of the cross section of the shaft portion of the present invention.

[Appendix 2]

With the cover structure or electronic equipment of the present invention, the shaft diameter can be configured to pass through the centroid of the cross section of the shaft portion.

[Appendix 3]

According to the cover structure or electronic equipment of the present invention, a cross-section shape of the shaft portion may be configured to be oval or elliptic.

With this configuration, when opening/closing the cover body against the casing, movement in the shaft diameter direction of the shaft portion loosely fitted in the bearing portion can be suppressed. Accordingly, the shaft portion can be prevented from coming into contact with the casing, and opening/closing operation can be performed smoothly.

[Appendix 4]

According to the cover structure or electronic equipment of the present invention, a cross-section shape of the shaft portion may be configured to be regular hexagonal or rectangular.

With this configuration, when opening/closing the cover body against the casing, movement in the shaft diameter direction of the shaft portion loosely fitted in the bearing portion can be suppressed. Accordingly, the shaft portion can be prevented from coming into contact with the casing, and opening/closing operation can be smoothly performed.

[Appendix 5]

According to the cover structure or electronic equipment of the present invention, the shaft portion may be configured to be disposed near the end portion of the cover portion.

With this configuration, because the cover body can be in a stable position, the opening/closing operability and assembling workability can be improved.

[Appendix 6]

The cover structure or electronic equipment of the present invention may be configured further to include an end portion, which is disposed on the end of the shaft portion, having a larger shaft diameter than the largest shaft diameter of the shaft diameters of the cross section of the shaft portion.

With this configuration, the shaft portion loosely fitted in the bearing portion can be prevented from easily coming off the bearing portion. Accordingly, the cover body can be prevented from coming off the casing.

[Appendix 7]

According to the cover structure or electronic equipment of the present invention, the end portion may be configured to have a taper-shaped side on the back side of the surface to which the shaft portion is provided.

With this configuration, when opening/closing the cover body against the casing, a gap between the end portion and the casing can be made larger. Consequently, the end portion can be prevented from coming into contact with the casing, and a cover structure with which opening/closing operation can be smoothly performed can be achieved.

Note that a first taper portion 43a and a second taper portion 43b are examples of taper shapes of the present invention.

[Appendix 8]

A mounting method of the present invention is for a cover structure including a cover portion that covers a part of a casing, the casing comprising a bearing portion and an opening portion that is provided to the bearing portion and a shaft portion that is provided to the cover portion. With the cover structure, a cross section of the shaft portion has shaft diameters with a plurality of lengths, the largest shaft diameter of the shaft diameters of the cross section of the shaft portion is larger than an inner diameter of the opening portion and smaller than an inner diameter of the bearing portion, and the smallest shaft diameter of the shaft diameters of the cross section of the shaft portion is smaller than the inner diameter of the opening portion. Furthermore, the method includes inserting the shaft portion into the bearing portion via the opening portion in the direction with smaller than the inner diameter shaft diameter of the shaft diameters of its cross section and rotating the cover portion about the shaft portion as an axis such that the cover portion is in a position where the direction of the largest shaft diameter of the shaft diameters of the cross section of the shaft portion is substantially perpendicular to the direction of movement of the shaft portion in the opening portion.

This method enables the cover body to be temporally fixed to the casing in a state where the shaft portion is loosely fitted into the bearing portion, resulting in improvement of workability upon assembling.

The present invention is useful in equipment, such as a digital camera, a video camera, a cell phone unit and the like, provided with various terminals such as a power supply terminal or an external connection terminal and further provided with a cover body for covering those terminals. In addition, components on the portion to be covered that can be covered with the cover structure of the present invention are not limited to terminals.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A cover structure comprising;
    a cover portion that covers a part of a casing;
    a shaft portion that is provided to the cover portion, the shaft portion being positioned substantially perpendicular relative to a back surface of the cover portion;
    a bearing portion that is provided to the casing; and
    an opening portion that is provided to the bearing portion,
    wherein a cross section at one position of the shaft portion has at least first and second shaft diameters with a plurality of lengths passing through a centroid of the cross section, and
    the largest shaft diameter of the shaft diameters of the cross section of the shaft portion is larger than an inner diameter of the opening portion and smaller than an inner diameter of the bearing portion, and
    the smallest shaft diameter of the shaft diameters of the cross section of the shaft portion is smaller than the inner diameter of the opening portion.

2. The cover structure according to claim 1,
    wherein a cross-section shape of the shaft portion is oval or elliptic.

3. The cover structure according to claim 1,
    wherein a cross-section shape of the shall portion is regular hexagonal or rectangular.

4. The cover structure according to claim 1,
    wherein the shaft portion is disposed near the end of the cover portion.

5. The cover structure according to claim 1, further comprising an end portion that is disposed on the end of the shaft portion and has a shaft diameter larger than the largest shaft diameter of the shaft diameters of the cross section of the shaft portion.

6. The cover structure according to claim 5,
    wherein the end portion has a taper-shaped side on a back side of the surface to which the shaft portion is provided.

7. Electronic equipment comprising:
    a casing; and
    a cover body that can cover a portion to be covered disposed on the casing,
    the casing comprising a bearing portion and an opening portion that is provided for the
    bearing portion,
    the cover body comprising:
        a cover portion that covers the portion to be covered; and
        a shaft portion that is provided to the cover portion, the shaft portion being positioned substantially perpendicular relative to a back surface of the cover body;
        wherein a cross section at one position of the shaft portion has at least first and second shaft diameters with a plurality of lengths passing through a centroid of the cross section, and
        the largest shaft diameter of the shaft diameters of the cross section of the shaft portion is larger than an inner diameter of the opening portion, but smaller than an inner diameter of the bearing portion, and
        the smallest shaft diameter of the shaft diameters of the cross section of the shaft portion is smaller than the inner diameter of the opening portion.

8. The electronic equipment according to claim 7,
    wherein a cross-section shape of the shaft portion is oval or elliptic.

9. The electronic equipment according to claim 7,
    wherein a cross-section shape of the shaft portion is regular hexagonal or rectangular.

10. The electronic equipment according to claim 7, wherein the shaft portion is disposed near the end of the cover portion.

11. The electronic equipment according to claim 7, further comprising an end portion that is disposed on the end of the shaft portion and has a shaft diameter larger than the largest shaft diameter of the shaft diameters of the cross section of the shaft portion.

12. The electronic equipment according to claim 11, wherein the end portion has a taper-shaped side on a back side of the surface to which the shaft portion is provided.

13. A method for mounting a cover structure comprising:
a cover portion that covers a part of a casing;
a shaft portion that is provided to the cover portion, the shaft portion being positioned substantially perpendicular relative to a back surface of the cover portion;
a bearing portion that is provided for the casing; and
an opening portion that is provided to the bearing portion, wherein a cross section at one position of the shaft portion has at least first and second shaft diameters with a plurality of lengths passing through a centroid of the cross section, and the largest shaft diameter of the shaft diameters of the cross section of the shaft portion is larger than an inner diameter of the opening portion, but smaller than an inner diameter of the bearing portion, and the smallest shaft diameter of shaft diameters of the cross section of the shaft portion is smaller than the inner diameter of the opening portion, the method comprising:

inserting the shaft portion into the bearing portion via the opening portion in the direction with smaller than the inner diameter shaft diameter of the shaft diameters of its cross section; and rotating the cover portion about the shaft portion as an axis such that the cover portion is in a position where the direction of the largest shaft diameter of the shaft diameters of the cross section of the shaft portion is substantially perpendicular to the direction of movement of the shaft portion in the opening portion.

* * * * *

UNITED STATES PATENT AND TRADEMARK OFFICE
CERTIFICATE OF CORRECTION

PATENT NO. : 7,903,396 B2
APPLICATION NO. : 12/360453
DATED : March 8, 2011
INVENTOR(S) : Masaaki Sasaki It is certified that error appears in the above-identified patent and that said Letters Patent is hereby corrected as shown below:

Column 12, line 26 (claim 1): "...shall..." should read --...shaft...--.

Signed and Sealed this
Nineteenth Day of July, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,903,396 B2 | Page 1 of 1 |
| APPLICATION NO. | : 12/360453 | |
| DATED | : March 8, 2011 | |
| INVENTOR(S) | : Masaaki Sasaki | |

It is certified that error appears in the above-identified patent and that said Letters Patent is hereby corrected as shown below:

Column 12, line 26 (claim 3): "...shall..." should read --...shaft...--.

This certificate supersedes the Certificate of Correction issued July 19, 2011.

Signed and Sealed this
Twenty-eighth Day of February, 2012

David J. Kappos
*Director of the United States Patent and Trademark Office*